United States Patent [19]

Watanabe

[11] Patent Number: 4,540,944
[45] Date of Patent: Sep. 10, 1985

[54] METHOD OF CONVERTING PULSE FREQUENCY IN A CONTROL CIRCUIT OF A PULSE MOTOR

[75] Inventor: Masaki Watanabe, Nagoya, Japan

[73] Assignee: Aisan Kogyo Kabushiki Kaisha, Aichi, Japan

[21] Appl. No.: 454,579

[22] Filed: Dec. 30, 1982

[30] Foreign Application Priority Data

Apr. 8, 1982 [JP] Japan .................................. 57-60212

[51] Int. Cl.³ ............................................ H03K 5/156
[52] U.S. Cl. ..................................... 328/22; 328/140;
307/519; 307/261; 307/271
[58] Field of Search ................... 328/22, 140, 139, 61,
328/127, 150; 307/261, 264, 271, 518, 519;
331/1 A, 177; 377/39, 45, 55, 56, 111, 114

[56] References Cited

U.S. PATENT DOCUMENTS

| | | | |
|---|---|---|---|
| 3,149,243 | 9/1964 | Garfield | 328/140 |
| 3,740,633 | 6/1973 | Buttafava | 307/519 |
| 3,870,898 | 3/1975 | Hoehn | 307/519 |
| 3,986,055 | 10/1976 | Barzely | 328/140 |
| 4,256,983 | 3/1981 | Griffith et al. | 307/271 |
| 4,410,812 | 10/1983 | Hönig et al. | 307/271 |

Primary Examiner—John S. Heyman
Attorney, Agent, or Firm—Dennison, Meserole, Pollack & Scheiner

[57] ABSTRACT

A method of converting pulse frequency in a control circuit of a pulse motor which comprises converting the constant frequency of pulses into the voltage corresponding thereto, leading the pulses having said voltage to a charge and discharge circuit having a preset time constant, converting the voltage of the pulses outputted from the charge and discharge circuit into the frequency corresponding to change in the voltage, feeding the pulses outputted from a V/F converter to the exterior, and stopping the output of the pulses converted by the V/F converter when the count number of the input pulses having the constant frequency becomes coincident with the count number of the pulses outputted from the V/F converter.

6 Claims, 16 Drawing Figures

METHOD OF CONVERTING PULSE FREQUENCY IN A CONTROL CIRCUIT OF A PULSE MOTOR

BACKGROUND OF THE INVENTION

This invention relates to a method of converting a pulse frequency in a control circuit of a pulse motor wherein constant pulse frequency outputted from the control circuit is converted into an arbitrary frequency corresponding to a slow-up and a slow-down characteristics of the pulse motor, without changing the number of the pulse.

Conventionally, it is necessary to continuously and gradually increase and decrease the pulse frequency while maintaining a pulse motor in a good condition upon start and stop of the pulse motor, so as to utilize the pulse motor throughout the range of applicable high frequency. For the purposes, the pulse motor control circuit becomes complicated or costly. In the case that a micro computer is used in the control circuit, the disadvantage seems to be that the associated software is complicated.

SUMMARY OF THE INVENTION

Accordingly, an object of the present invention is to provide a method of converting pulse frequency for readily effecting a slowup and a slow-down characteristics with a simple circuit while maintaining a good condition of a pulse motor upon start and stop of the pulse motor.

Another object of the present invention is to provide a method of converting pulse frequency for automatically converting a constant pulse frequency outputted from a pulse motor control circuit into an arbitrary frequency corresponding to a slow-up and a slow-down characteristics of a pulse motor, without changing the number of the pulse, upon start and stop of the pulse motor.

According to the present invention, the constant frequency of pulses is converted into the voltage corresponding thereto, and then the pulses having the voltage are led to a charge and discharge circuit having a preset time constant, and then the voltage of the pulses outputted from the charge and discharge circuit is converted into the frequency corresponding to change in the voltage, and then the pulses outputted from a V/F converter are fed to the exterior, and at the same time, the output of the pulses converted by the V/F converter is stopped when the count number of the input pulses having the constant frequency becomes coincident with the count number of the pulses outputted from the V/F converter.

Various general and specific objects, advantages and aspects of the invention will become apparent when reference is made to the following detailed description of the invention considered in conjunction with the related accompanying drawings.

DETAILED DESCRIPTION OF THE PREFERRED EMBODIMENTS

Figure 1:
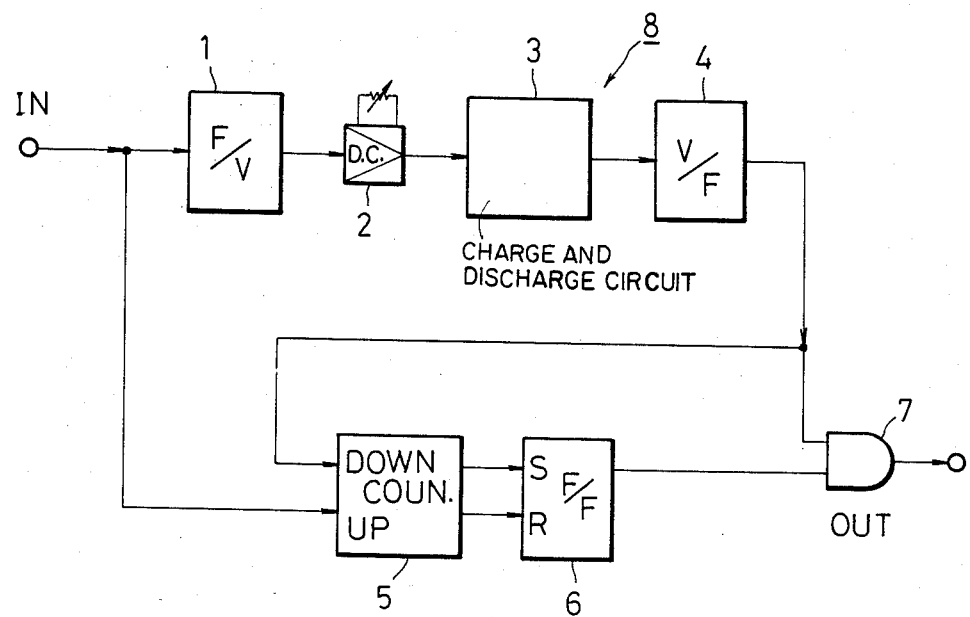
FIG. 1 illustrates a schematic diagram of the circuitry of the first preferred embodiment according to the present invention.
Figure 2:
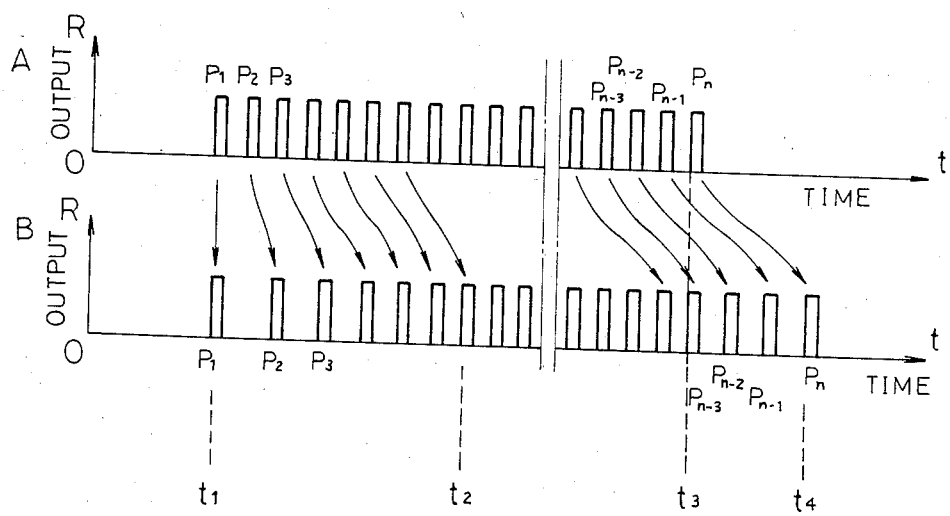
FIGS. 2A, 2B, 3A and 3B show operational characteristics of FIG. 1.
Figure 3:
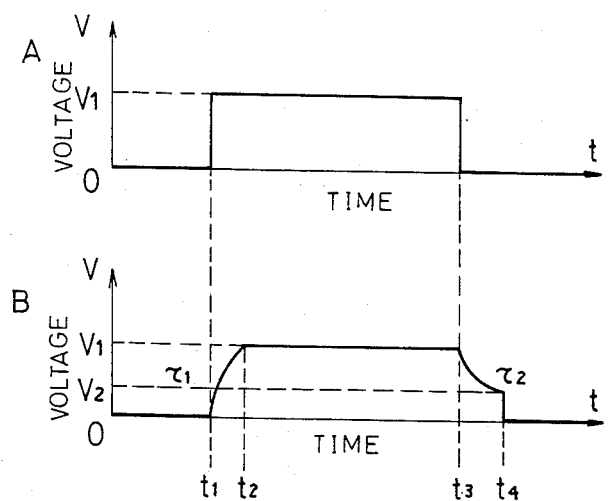
Figure 4:
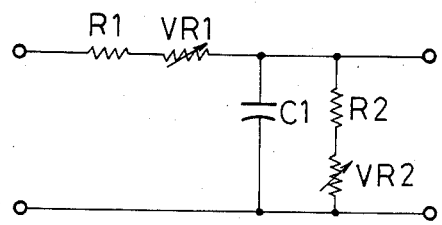
FIG. 4 illustrates a schematic diagram of the charge and discharge circuit in FIG. 1.

As shown in FIG. 2A, pulses $P_1-P_n$ are derived from a pulse motor control circuit (not shown) for driving a pulse motor. The pulses $P_1-P_n$ are converted into the voltage $V_1$ corresponding to the frequency $f_1$ as shown in FIG. 3A by a F/V converter. Output from the F/V converter is inputted through a DC amplifier 2 and a charge and discharge circuit 3 into a V/F converter 4. The charge and discharge circuit 3 is consisted of resistances $R_1$ and $R_2$, variable resistance $VR_1$ and $VR_2$ and capacitor $C_1$, and has time constants $\tau_1$ and $\tau_2$ upon charging and discharging, respectively. As shown in FIG. 3B, every time supply of the pulses $P_1-P_n$ to the F/V converter 1 is started and stopped, pulses $P_1-P_n$ are outputted from the V/F converter 4 as shown in FIG. 2B. The pulses $P_1-P_n$ has a frequency corresponding to the voltage change as shown in FIG. 3B which is determined by the time constant $\tau_1$ and $\tau_2$ of the charge and discharge circuit 3. THe pulses having a constant frequency inputted into the F/V converter 1 and the pulses outputted from the V/F converter 4 are inputted into the terminal UP and the terminal DOWN of an updown counter 5, respectively. The pulses outputted from the V/F converter 4 are also outputted through an and gate 7 to a pulse motor driving circuit (not shown). The gate 7 is opened and closed by the outputs from a F/F circuit 6 which is set and reset by the outputs from the updown counter 5.

In operation, upon starting of the pulse motor, when the pulses having a constant frequency $f_1$ are inputted into the counter 5 of an automatic pulse frequency converting circuit 8 for driving a pulse motor, the F/F circuit 6 is set by the up-count of the counter 5 and the gate 7 is opened. At the same time, the pulses having a constant frequency $f_1$ are also inputted through the F/V converter 1, the DC amplifier 2 and the charge and discharge circuit 3 to the V/F converter 4, wherein the frequency is automatically converted corresponding to the slow-up characteristic of the pulse motor which is maintained in a good condition. The pulses outputted from the V/F converter 4 are applied to one input of the and gate 7. The output pulses from V/F converter 4 are also applied to and counted down by the counter 5, wherein the number of count is not decreased to zero since the number of up-count is larger than the number of down-count during the stationary operation after slow-up, and accordingly the F/F circuit 6 remains set and the gate 7 is maintained in an open condition.

In the case that the pulse motor is to be stopped under the condition as described above, that is, the pulse output from the pulse motor control circuit is stopped under the condition that the pulse having a constant frequency is outputted, the pulse having a frequency corresponding to the slow-down characteristic of the pulse motor is outputted from the V/F converter. As the number of the input pulse in the automatic pulse frequency converting circuit 8 is not coincident with the number of the output pulse in the above mentioned condition, the counter 5 remains unvaried and the pulse having the frequency corresponding to the slow-down characteristic of the pulse motor is outputted from the gate 7. The pulse is counted down at the counter 5. When the count number of the counter 5 becomes zero, that is, the number of the output pulse from the gate 7 becomes coincident with the number of the pulse outputted from the pulse motor control circuit correspondingly to the amount of movement of the pulse motor, the F/F circuit 6 is reset to close the gate 7 and the pulses output from the circuit 8 is stopped.

Figure 5:
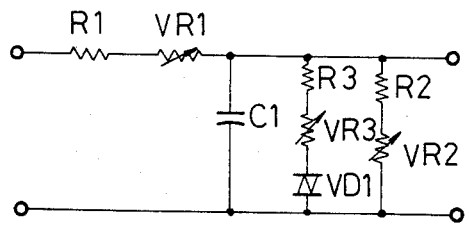
FIG. 5 illustrates a schematic diagram of a charge and discharge circuit of a second preferred embodiment according to the present invention.
Figure 6:
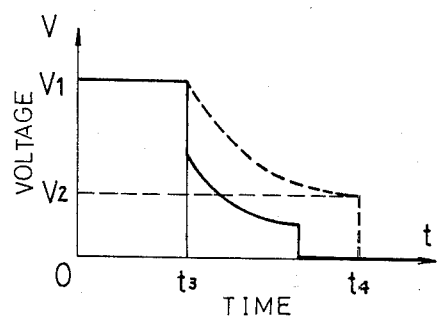
FIG. 6 shows an operational characteristic of FIG. 5.

As shown in FIGS. 5 and 6 illustrating the second preferred embodiment, the discharge characteristic of the charge and discharge circuit 3 corresponding to the stop characteristic of the pulse motor is changed by connecting the series circuit of resistance $R_3$, variable resistance $VR_3$ and varistor $VD_1$ parallel to the series circuit of resistances $R_2$ and variable resistance $VR_2$, thereby rapidly stopping the pulse motor in such a manner that the accuracy of the stop position of the pulse motor is maintained, wherein the charge and discharge characteristics of the capacitor $C_1$ corresponding to the slow-up and slow-down characteristics of the pulse motor may be arbitrarily changed by the variable resistances $VR_1$, $VR_2$ and $VR_3$.

Figure 7:
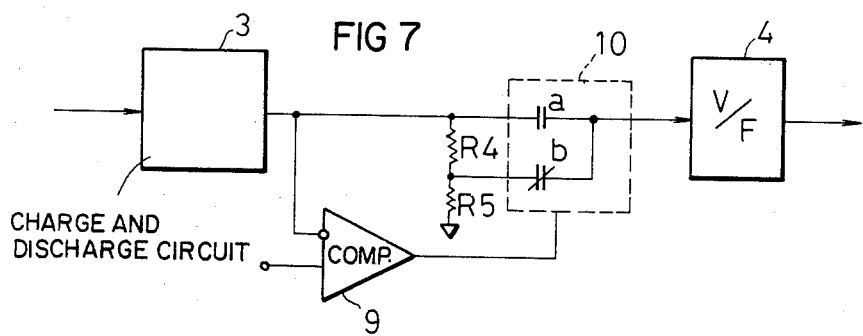
FIGS. 7 and 9 illustrate schematic diagrams of the circuits of the third and the fourth preferred embodiments according to the present invention.
Figure 8:
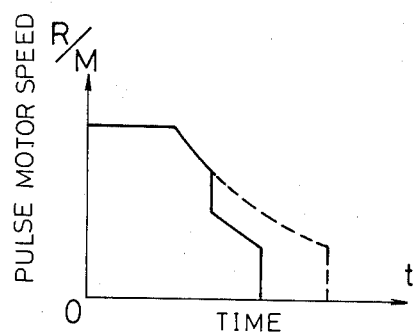
FIG. 8 shows an operational characteristic of FIGS. 7 and 9.

As shown in FIGS. 7 and 8 illustrating the third preferred embodiment, between the charge and discharge circuit 3 and V/F converter 4, a comparator 9 for changing the output upon starting the slow-down, an analog switch 10 and resistances $R_4$ and $R_5$ as a voltage divider are provided, thereby changing the voltage outputted from the circuit 3 to the V/F converter 4 through the resistances $R_4$ and $R_5$ by switching the analog switch 10 responsive to the output from the comparator 9.

Figure 9:
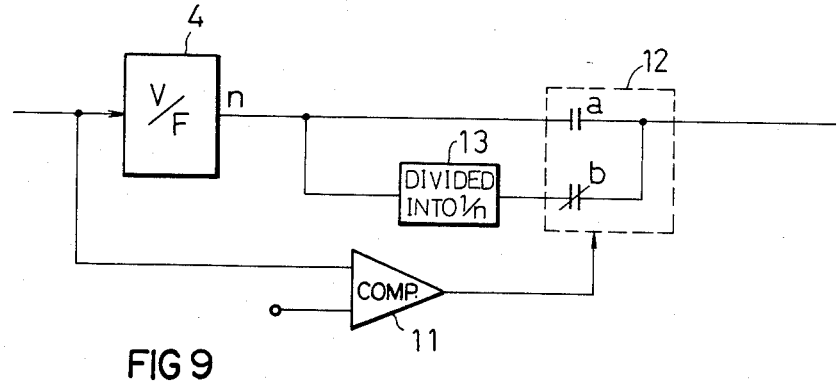

As shown in FIG. 9 illustrating the fourth preferred embodiment, the frequency of the output pulse from the V/F converter 4 may be changed through a frequency divider 13 by switching an analog switch 12 responsive to the output from a comparator 11, thereby obtaining the stop characteristic of the pulse motor as shown in FIG. 8. The slow-up and slow-down characteristics obtained by each circuit as mentioned above may be readily changed by changing the constant of each circuit by a variable resistance and a variable capacitor.

Figure 10A:
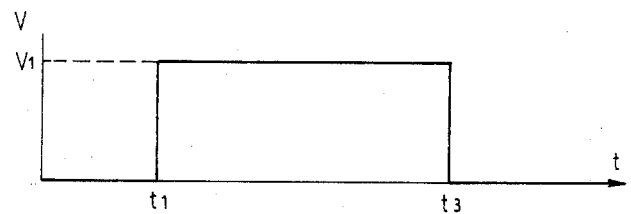
FIGS. 10A-10E show the operational waveform characteristics of the fifth preferred embodiment according to the present invention.
Figure 10B:
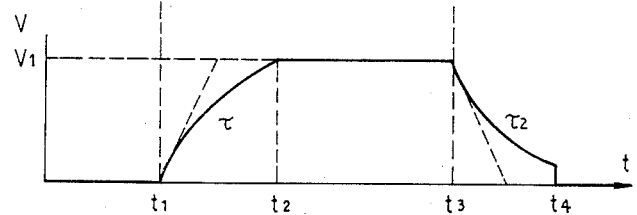
Figure 10C:
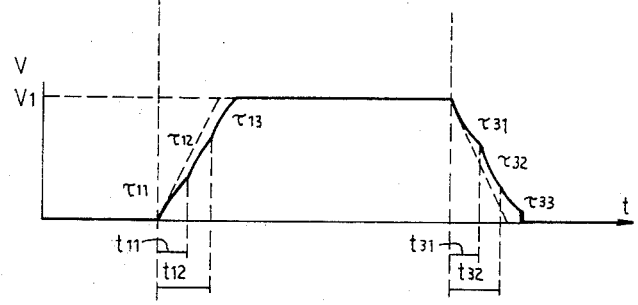
Figure 10D:
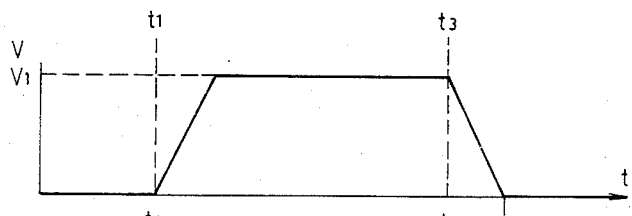

It is generally necessary to shorten the time for obtaining such a slow-up and slow-down characteristic as hereinabove described. Particularly, in the case that the drive torque in the drive system, wherein the number of rotation of a load is equal to that of a motor, indicates a constant torque characteristic, it is preferred that the slow-up and slow-down characteristic is a linear or trapezoidal characteristic. FIG. 10D shows an ideal slow-up and slow-down characteristic.

As one example, closer to the ideal characteristic may be realized by switching time constants. In other words, the input characteristic shown in FIG. 10A is changed into the output characteristic as shown in FIG. 10B by providing a charge and discharge circuit with the pulse frequency converting circuit. By starting the timer upon inputting the pulses to sequentially switch the analog switch and switching the time constant upon charging and discharging, the output characteristic as shown in FIG. 10C which approximates the ideal output characteristic as shown in FIG. 10D. Accordingly, the time for obtaining the slow-up and slow-down characteristic may be shortened.

Figure 11:
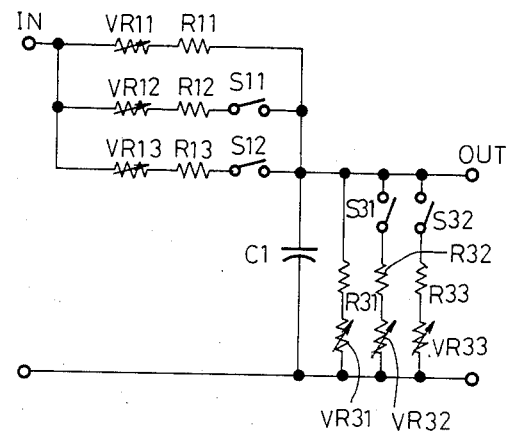
FIG. 11 shows an essential part of the circuit corresponding to FIGS. 10C and 10E.

Referring to FIG. 11 which illustrates one embodiment of such time constant switching circuit, when pulses are inputted to the circuit, the input is charged by resistance $R_{11}$ and variable resistance $VR_{11}$, wherein the time constant is indicated by $\tau_{11}$ in FIG. 10C. After the time $t_{11}$ proceeds, the analog switch $S_{11}$ goes on by the operation of the timer (not shown) and the resistances $R_{11}+VR_{11}$ and $R_{12}+VR_{12}$ are synthesized, wherein the time constant is indicated by $\tau_{12}$ in FIG. 10C. Similarly, after the time $t_{12}$ proceeds, the analog switch $S_{12}$ goes on, wherein the time constant is indicated by $\tau_{13}$ in FIG. 10C. Accordingly, the slow-up characteristic as shown in FIG. 10C is approximated by the ideal characteristic as shown in FIG. 10D.

Upon discharging, the times $t_{31}$ and $t_{32}$ are obtained by the timer which is previously started to operate. After the times $t_{31}$ and $t_{32}$ proceed, the analog switches $S_{31}$ and $S_{32}$ sequentially goes on, respectively, and the resistances $R_{31}+VR_{31}$ and $R_{32}+VR_{32}$ are synthesized and in sequence, the resistances $R_{31}+VR_{31}$, $R_{32}+VR_{32}$ and $R_{33}+VR_{33}$ are synthesized, wherein the time constant is sequentially determined to $\tau_{31}$, $\tau_{32}$ and $\tau_{33}$. Accordingly, the slow-down characteristic as shown in FIG. 10C is similarly approximated by the ideal characteristic as shown in FIG. 10D.

Figure 10E:
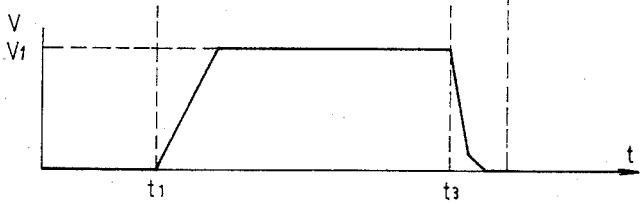

As is apparent from the forgoing description, the slow-up and slow-down characteristic approximating the trapezoidal characteristic may shorten the time for the slow-up and slow-down operation. In particular, the time for the slow-down operation may be further shortened with improved stop accuracy by changing the inclination of the slow-down slopes at the first and the second halves as shown in FIG. 10E.

Having thus described the preferred embodiment of the invention it should be understood that numerous modifications and adaptations may be resorted to without departing from the spirit of the invention.

What is claimed is:

1. A method of converting pulse frequency in a control circuit of a pulse motor comprising: converting the constant frequency input of pulses into a voltage indicative thereof in a F/V converter, inputting such corresponding voltage to a charge and discharge circuit having a preset time constant, converting the output voltage from said charge and discharge circuit into output pulses having changing frequencies corresponding to changes in the voltage in a V/F converter, feeding such output pulses to the circuit output and stopping the output of such output pulses when the number of such input pulses becomes coincident with the number of such output pulses.

2. A method of converting pulse frequency as defined in claim 1, wherein a discharge characteristic of said charge and discharge circuit is changed by connecting a series circuit of resistance, variable resistance and varistor parallel to another series circuit of resistance and variable resistance.

3. A method of converting pulse frequency as defined in claim 1 so as to slow it down, wherein said output voltage from the charge and discharge circuit is changed by providing a comparator for changing the output upon starting the slow-down, an analog switch, and plural resistances as a voltage divider between said charge and discharge circuit and said V/F converter and switching said analog switch responsive to the output from said comparator.

4. A method of converting pulse frequency as defined in claim 3, wherein the frequency of the output pulse from said V/F converter is changed through a frequency divider by switching said analog switch responsive to the output from said comparator.

5. A method of converting pulse frequency as defined in claim 3, wherein said analog switch is sequentially switched by the operation of a timer upon inputting the pulses so as to sequentially switch time constants during charge and discharge operations and to provide a slow-up and slow-down characteristic approximated by a trapezoidal output characteristic.

6. A method as defined in claim 1 wherein said step of stopping the output comprises feeding such outputted pulse to the down count input of a up-down count, feeding the constant frequency input pulses to the up input of such up-down counter, feeding the output of such up-down counter to a S-R F/F so that a zero count turns off the F/F output, and feeding the F/F output and the output pulses to separate inputs of an and gate.

* * * * *